United States Patent

Ochii

Patent Number: 5,315,546
Date of Patent: May 24, 1994

[54] NON-VOLATILE SEMICONDUCTOR MEMORY USING A THIN FILM TRANSISTOR

[75] Inventor: Kiyofumi Ochii, Yokohama, Japan

[73] Assignee: Kabushiki Kaisha Toshiba, Kawasaki, Japan

[21] Appl. No.: 707,064

[22] Filed: May 29, 1991

[30] Foreign Application Priority Data

May 30, 1990 [JP] Japan ................... 2-138529

[51] Int. Cl.⁵ .................. G11C 11/34; H01L 29/68
[52] U.S. Cl. ................... 365/185; 365/182; 257/314; 257/320
[58] Field of Search ............ 365/185, 182; 257/314, 257/320, 321

[56] References Cited
U.S. PATENT DOCUMENTS

| | | | |
|---|---|---|---|
| 4,016,588 | 4/1977 | Ohya et al. | 365/185 |
| 4,503,519 | 3/1985 | Arakawa | 365/104 |
| 4,597,000 | 6/1986 | Adam | 357/23.5 |
| 4,725,980 | 2/1988 | Wakimoto et al. | 365/185 |
| 4,967,393 | 10/1990 | Yokoyama et al. | 365/185 |
| 5,040,147 | 8/1991 | Yoshizawa et al. | 365/185 |
| 5,063,423 | 11/1991 | Fujii et al. | 357/23.5 |

Primary Examiner—Rolf Hille
Assistant Examiner—David Ostrowski
Attorney, Agent, or Firm—Finnegan, Henderson, Farabow, Garrett & Dunner

[57] ABSTRACT

A MOS transistor has a floating gate, which forms a memory cell of EPROM, and a control gate. The control gate is formed of a thin film. An impurity concentration of a region corresponding to the floating gate is lower than that of the other regions. The region having low impurity concentration functions as a channel region of a thin film transistor. The floating gate functions as a gate of the thin film transistor. In the memory cell in which an electron is written in the floating gate, a threshold voltage of the thin film transistor rises, and the thin film transistor is set to be in an off state. In the memory cell in which no electron is written in the floating gate, the threshold voltage of the thin film transistor lowers, and the thin film transistor is set to be in an on state. If the voltage of said control gate rises in a reading operation, an inversion layer is formed in the only cell of the erasing state and the high voltage of the control gate is supplied to a channel region, and the MOS transistor is turned on. Due to this, the voltage, which is higher than the threshold value of the memory cell of the writing state, can be supplied to the control gate.

8 Claims, 4 Drawing Sheets

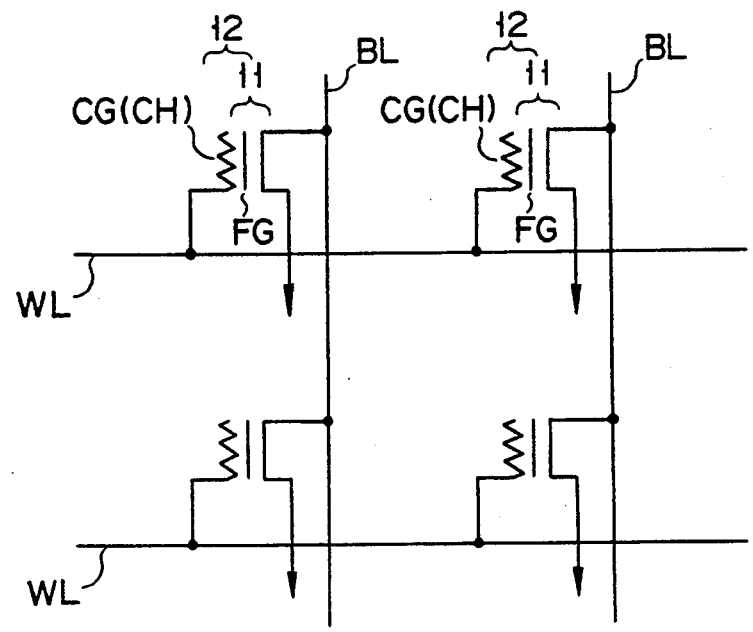
F I G. 1
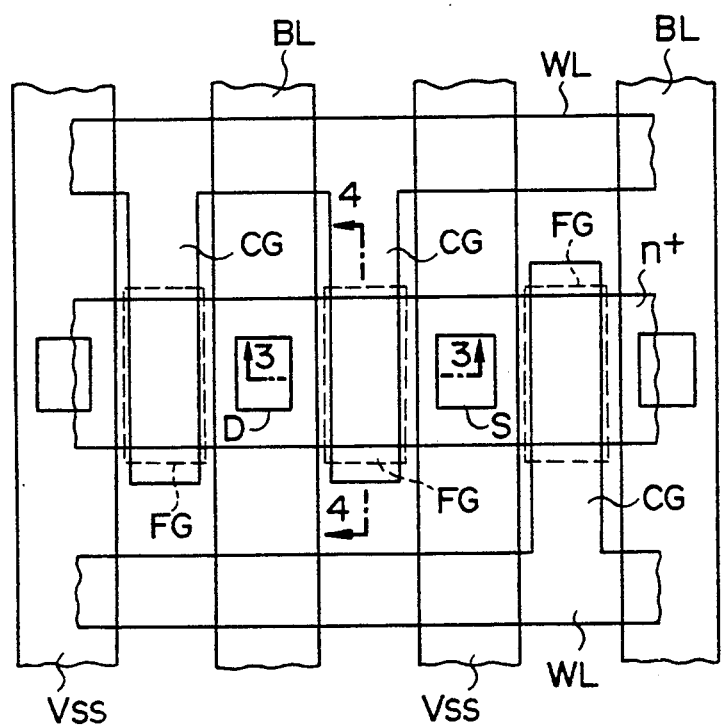
F I G. 2

NON-VOLATILE SEMICONDUCTOR MEMORY USING A THIN FILM TRANSISTOR

BACKGROUND OF THE INVENTION

1. Field of the Invention

The present invention relates to a non-volatile semiconductor memory having a floating gate and a control gate such as an EPROM (Erasable and Programmable ROM) and an E$^2$PROM (Electrically Erasable and Programmable ROM).

2. Description of the Related Art

FIG. 8 shows a conventional non-volatile semiconductor memory, for example, an ultraviolet erasable EPROM. FIG. 9 shows a cross sectional structure of FIG. 8.

In the drawing, in a P-type substrate 21, there are formed N type diffusion layers 22 and 23. An an insulating film (not shown) is formed on the P-type substrate 21. A first layer made of polysilicon is a floating gate FG. A second layer made of polysilicon is a control gate CG serving as both an electrode and an access gate to a cell. In this case, both distances d1 and d2 as shown in FIG. 8 are several hundreds $\mu$m.

In a case where data is written to the non-volatile semiconductor memory, high voltage of 12.5 V is applied to the control gate CG (word line WL) of the transistor, and at the same time high voltage of about 8 V is supplied to a drain electrode (bit line BL). Then, a hot electron is generated in a channel region, which is in a pinch off state, and this is caught by the floating gate FG. In this type of non-volatile semiconductor, it is desirable that the shift of threshold voltage be large under a condition that the applied voltage is low and the writing time is short.

On the other hand, data retaining characteristic is also important when data writing or reading is not operated, or the reading is operated. It is required that these opposed operations be conformed to a certain characteristic to obtain high reliance.

Moreover, if stored data is read out, the conventional non-volatile semiconductor memory of FIG. 9 is operated by a single power source of 5 V. More specifically, if the control gate CG is selected, a voltage, which is C2/(C1+C2) times the voltage supplied to the control gate CG, is applied to the floating gate FG. C1 is a capacitor, which is between a substrate 21 and the floating gate FG, and C2 is a capacitor, which is between the floating gate FG and the control gate CG. In this state, the shift of the threshold value before or after writing is sensed and amplified by a sense amplifier (not shown). In order to erase the written data, an ultraviolet ray is radiated to the floating gate FG, the electron is excited to be high energy, thereby discharging the electron from the floating gate FG. It is characterized that bits of the ultraviolet erasable EPROM is erased at the same time.

The conventional volatile semiconductor memory has a strong relation with the amount of writing and the reading current. Due to this, in a case where the amount of writing hot electrons varies, the reading speed varies, thereby making it difficult for the speed of the volatile semiconductor memory to be higher.

Moreover, if the hot electrons are written in the floating gate many times, the shift of the threshold values reduces, and endurance deteriorates. Due to this, there occur problems in which the number of times of data writing decreases and reliance lowers. Particularly, if the memory cell is made hyperfine or the voltage is lowered, there are needed a high boosting voltage, a long writing time, and a thin gate oxide film in order to reserve the amount of hot electrons to be injected to the floating gate in the data writing operation. In this case, the above-mentioned problems are more serious.

SUMMARY OF THE INVENTION

An object of the present invention is to provide a non-volatile semiconductor memory wherein reading current can be reserved without depending on the amount of writing of hot electrons even if the memory cell is made hyperfine and the voltage is lowered, and the number of times of writing can be prevented from being reduced due to the variation of the writing characteristic and the deterioration of endurance, thereby making it possible to improve reliance.

The present invention can be attained by the following structure.

The present invention provides a non-volatile semiconductor memory which comprises:

an insulating gate transistor having a floating gate and a control gate formed of a thin film; and a thin film transistor formed of said control gate and said floating gate wherein a portion of said control gate corresponding to said floating gate is a channel region having impurity concentration, which is lower than the other portions, and said floating gate is a gate electrode controlling said channel region.

According to the present invention, in a cell in a state that an electron is written in the floating gate, the threshold voltage of the thin film transistor increases and the cell is set to be in an OFF state. In a cell in an erasing state, the threshold voltage of the thin film transistor decreases and is set to be in an ON state. If the voltage of the control gate is high in a reading operation, an inversion layer is formed in the thin film transistor of only the cell which is in the erasing state. Then, the high voltage of the control gate is supplied to the channel region and a insulating gate transistor (a MOS transistor) is turned on. In the conventional cell, the high voltage can be supplied to the control gate only in the range of which NMOS in the writing state is not turned on when reading. However, in the present invention, the voltage, which is higher than the threshold value of NMOS in the cell of the writing state, can be supplied to the control gate.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram of an equivalent circuit showing a first embodiment of the present invention;

FIG. 2 is a plane view showing a cell structure of FIG. 1;

DETAILED DESCRIPTION OF THE PREFERRED EMBODIMENTS

Figure 3:
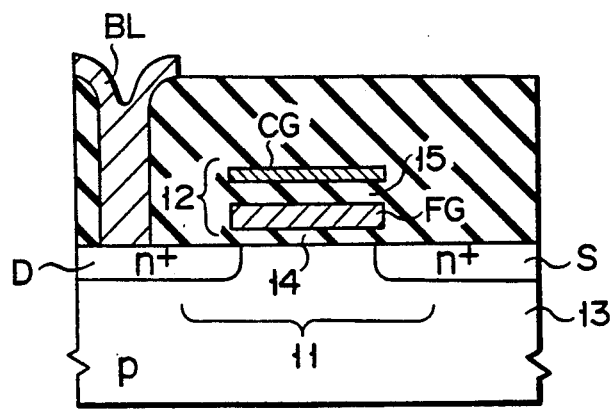
FIG. 3 is a cross sectional view taken along the lines 3—3 of FIG. 2.

The embodiments of the present invention will be explained with reference to the drawings.

FIG. 1 shows a first embodiment of the present invention. In the drawing, a control gate CG of an N channel MOS transistor 11 (hereinafter called NMOS transistor) comprises a channel region CH of a thin film transistor 12 formed of, for example, polysilicon. A floating gate FG serves as a gate electrode of the thin film transistor 12. A drain of the NMOS transistor 11 is connected to a bit line BL, and the control gate CG is connected to a word line WL.

Figure 4:
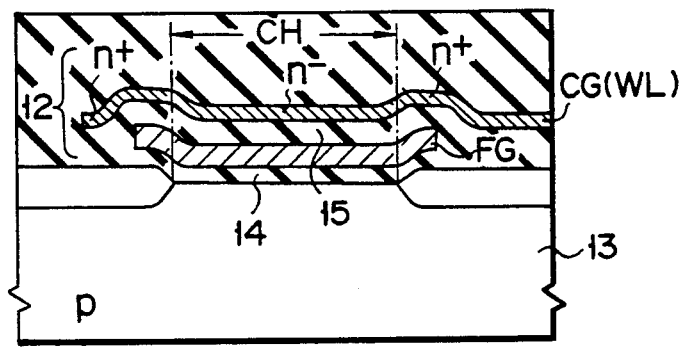
FIG. 4 is a cross sectional view taken along the lines 4—4 of FIG. 2.

More specifically, as shown in FIGS. 2 to 4, in a p type semiconductor substrate 13, there is formed a source S, which forms the NMOS transistor 11, and a drain D. An oxide film 14 is formed on the semiconductor substrate 13, and the floating gate FG is formed on the oxide film 14. An insulating film 15 is formed on the floating gate FG, and the channel region CH of the thin film transistor 12 is formed on the insulating film 15. The thin film forming the channel region CH is integrated with the word line WL. As shown in FIG. 4, the channel region CH has a low impurity concentration n- and the other portions have high impurity concentration n+. Moreover, the bit line BL connected to the drain D.

In the above-structured thin film transistor 12, whether or not an inversion layer is formed in the channel region CH is determined by whether the electron is injected in the floating gate FG or not. In other words, the thin film transistor 12 forms a switched capacitor, which can change the voltage of the channel region CH by whether or not the electron is injected in the floating gate FG.

Figure 5A:
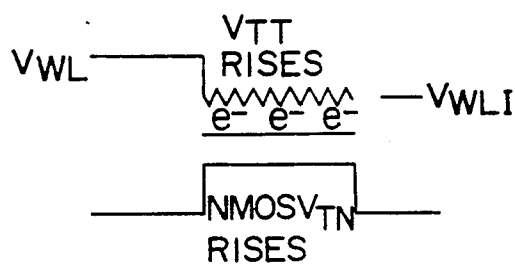
FIG. 5A and FIG. 5B are views explaining how the threshold voltage of a memory cell changes.
Figure 5B:
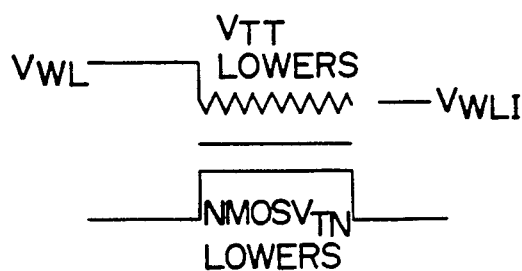

FIGS. 5A and 5B show a threshold voltage $V_{TN}$ of NMOS transistor and a threshold voltage $V_{TT}$ of the thin film transistor 12, respectively. Also, FIG. 5A shows a writing state, and FIG. 5B shows an erasing state.

In a state that an electron e- is injected in the floating gate FG shown in FIG. 5A, the threshold voltage of NMOS transistor 11 rises and the threshold voltage $V_{TT}$ of the thin film transistor 12 also rises. Moreover, in the erasing state shown in FIG. 5B, the threshold voltage of NMOS transistor lowers and the threshold voltage $V_{TT}$ of the thin film transistor 12 also lowers.

Figure 6:
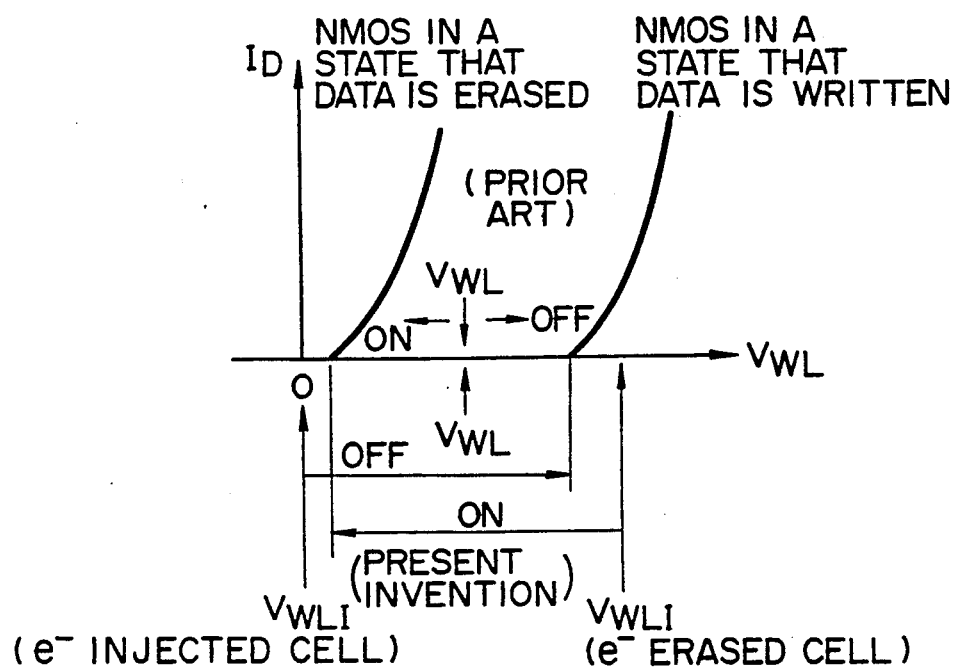
FIG. 6 is a view explaining a state of a reading operation of the prior art and that of the present invention.

In the conventional non-volatile semiconductor memory of FIG. 6, the voltage $V_{WL}$ of the control gate (word line WL) in the reading operation is set to an intermediate value between the threshold voltage of the erased NMOS transistor and that of the written NMOS transistor. Then, the erased cell is turned on and the written cell is turned off on the basis of voltage $V_{WL}$ of the control gate. A sense amplifier senses the voltage difference between the above voltages, amplifies the voltage difference, and outputs data of "0" or "1." Due to this, if the amount of writing is insufficient and the characteristic varies, a margin for turning the cell on or off decreases, the reading speed is deteriorated, and reading failure occurs.

In contrast, in the embodiment of the present invention, as shown in FIG. 6, the thin film transistor 12 in a state that the electron is written is set to have low conductivity and be turned off, and the thin film transistor 12 in the erasing state is set to have high conductivity and be turned on. It is, of course, necessary to provide a sufficient margin in order to obtain the above set states, however, discrimination between ON and OFF may be simply made. On-current of the thin film transistor 12 is not specially restricted. The channel region CH may be charged up to the voltage $V_{WL}$ of the word line within time, which is sufficiently shorter than the data reading time. Also, off-current of the thin film transistor 12 may be set to the state that time, which is needed to charge the channel region CH up to the voltage $V_{WL}$ of the word line, is sufficiently longer than the data reading time.

In the above set state, if the voltage of the control gate CG (word line WL) becomes high in the reading operation, an inversion layer is formed in the channel region CH of the thin film transistor 12 of only the erasing state cell shown in FIG. 5B. Due to this, the high voltage of the control gate CG is supplied to the channel region CH, and NMOS transistor 11 is turned on.

In the conventional cell, the voltage, which can be supplied to the control gate, was in only the range of which the NMOS transistor in the cell of the writing state is not turned on. However, in the above embodiment, the voltage of the control gate CG is the threshold of the NMOS transistor and not restricted. For this reason, the voltage, which is higher than the threshold of NMOS transistor in the cell of the writing state, can be supplied to the control gate CG.

On the other hand, in the cell of the writing state shown in FIG. 5A, even if the high voltage is applied to the control gate CG, no inversion layer is formed in the channel region CH. Due to this, the channel region CH of the thin film transistor 12 does not become high, and NMOS transistor 11 is maintained in the off state and no cell current flows.

According to the above embodiment, an electrode layer, which forms the control gate CG, is formed of polysilicon thin film. The portion corresponding to the floating gate FG of polysilicon thin film is used as the channel region CH having low impurity concentration, and the other regions have high impurity concentration. Thereby, the thin film transistor 12 wherein the floating gate FG is used as a gate electrode is formed.

Therefore, even if the writing/erasing characteristics are deteriorated, the on/off state of the memory cell is set on the basis of the threshold of the thin film transistor 12, so that the margin for the reading current can be reserved. Due to this, endurance can be improved. Moreover, even if the memory cell is made hyperfine and the voltage is lowered, the reading current can be increased without depending on the amount of writing to the floating gate FG. For this reason, the number of times of writing can be prevented from being reduced due to the variation of the writing characteristic and the deterioration of endurance, thereby making it possible to improve reliance.

Moreover, the threshold of the thin film transistor 12 is set to be lower, thereby the amount of injection of electrons in writing can be reduced. Due to this, shortening writing time, reduction of boosting voltage, and thicking the thin gate oxide film can be made.

Furthermore, the voltage, which is higher than the threshold of NMOS transistor 1 in the cell of the writing state, can be supplied to the control gate CG. Due to this, even if the threshold varies, the output current of the memory cell can be constant.

In the above embodiment, the thin film transistor, which forms the memory cell, may not be always completely turned on or off. In other words, the data reading time of the device and the time constant for charging the channel may be different from each other.

Also, the above thin film was formed of polysilicon, however, amorphous silicon may be used.

Moreover, the above thin film may be formed of monocrystal silicon. In this case, the film is not always formed to be thin.

Figure 7:
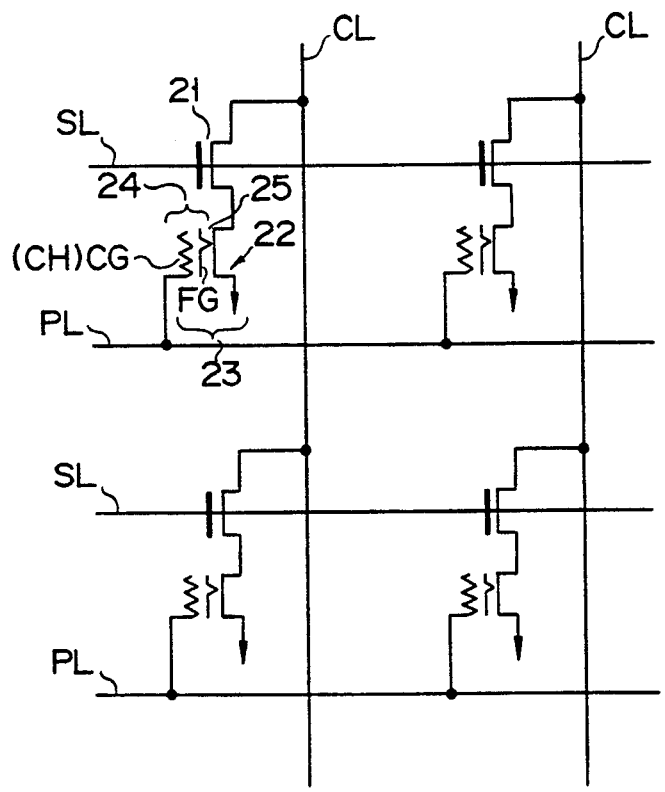
FIG. 7 is a diagram of an equivalent circuit showing a second embodiment of the present invention.
Figure 8:
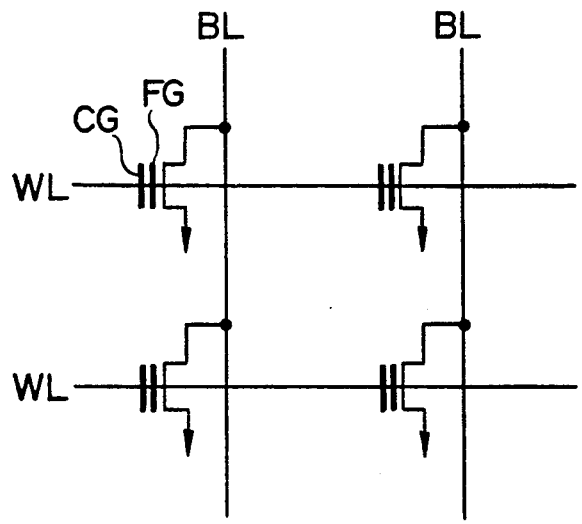
FIG. 8 is an equivalent circuit showing a conventional non-volatile semiconductor memory.
Figure 9:
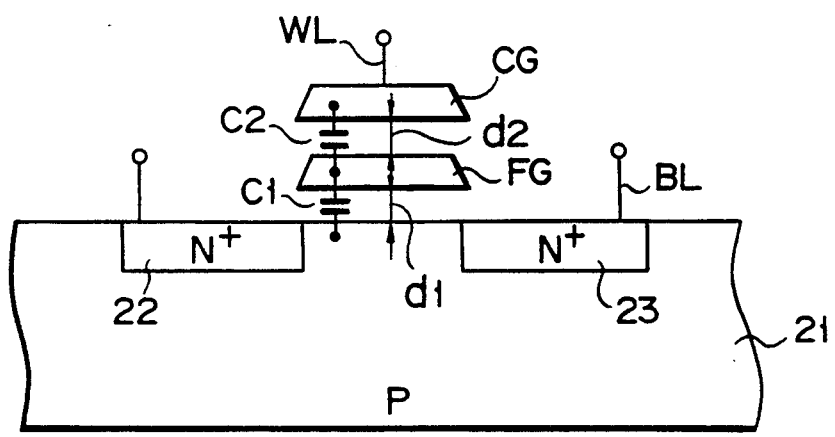
FIG. 9 is a cross sectional view showing the structure of the memory cell shown in FIG. 8.

FIG. 7 shows a second embodiment of the present invention, which is applied to E²PROM.

In the drawing, E²PROM comprises a selection transistor 21 and a memory transistor 22. The drain of the select transistor 21 is connected to a column line (bit line) CL, and the select gate is connected a select line SL. The source of the select transistor 21 is connected to the drain of the memory transistor 22. The source of the memory transistor 22 is connected to a predetermined power source (not shown).

In the memory transistor 22, the control gate CG of an NMOS transistor 23 is formed of a channel region CH of a thin film transistor 24 formed of polysilicon. A floating gate FG serves as a gate electrode of the thin film transistor 24. In a part of the floating gate GF, there is formed an extremely thin tunnel portion 25 formed of an oxide film. The control gate CG of the NMOS transistor 23 is connected to a program line (word line) PL.

In E²PROM, the select line SL and the program line PL are separated from each other, and the voltage is supplied to the program line PL. Then, the only cell selected by the select line is written or erased. In a case of the cell selected by the select line SL, the select transistor 21 is in an on state, and the drain of the memory transistor 22 is connected to the column line CL. This is the same structure as that of EPROM shown in the first embodiment. Therefore, if the high voltage is applied to the program line, the cell, which is in the erasing state, outputs current, and the cell, which is in the writing state, does not output current.

Moreover, erasing the written data is performed in the same as the case of normal E₂PROM.

The same effect, which was obtained in EPROM, can be obtained in E²PROM.

Additionally, various modifications can be, of course, achieved without departing from the gist of the present invention is not changed.

What is claimed is:

1. A semiconductor memory device, comprising:
a semiconductor substrate;
a diffusion layer formed in said semiconductor substrate and serving as a source and drain region;
a floating gate formed on said semiconductor substrate to be insulated from said semiconductor substrate;
a control gate made of a thin film and formed on said floating gate to be insulated from said floating gate; and
a transistor including said control gate and said floating gate wherein one end of a current path of said insulating gate transistor is connected to a bit line and the other end is connected to a power source and said control gate is connected to a word line, and a portion of said control gate corresponding to said floating gate is a channel region having an impurity concentration, which is lower than that of other portions of the control gate, and said floating gate is a gate electrode controlling said channel region.

2. A device according to claim 1, wherein conductivity of said transistor differs with a writing state that an electron is injected in said floating gate and an erasing state that said electron is discharged.

3. A device according to claim 2, wherein said drain of said insulating gate transistor is connected to said bit line, said source is connected to a power source, and said control gate is connected to said word line.

4. A device according to claim 1, wherein said thin film is formed of polysilicon.

5. A device according to claim 1, wherein said thin film is formed or amorphous silicon.

6. A device according to claim 1, wherein said thin film is formed of single crystal silicon.

7. A semiconductor device, comprising:
an insulating gate transistor serving as a memory cell having a floating gate and a control gate wherein one end of a current path of said insulating gate transistor is connected to a bit line and another end is connected to a power source, and said control gate is connected to a word line; and
a transistor including said control gate and said floating gate wherein said control gate is formed of a thin film, a portion corresponding to said floating gate is a channel region having an impurity concentration, which is lower than that of other portions of said control gate, said floating gate is a gate electrode controlling said channel region, a threshold voltage of said transistor of said memory cell, in which an electron is injected in said floating gate, increases and said transistor is set to be in an off state, said threshold voltage of said transistor of said memory cell, in which the electron is emitted from said floating gate, decreases and said thin film transistor is set to be in an on state, and if the voltage of said control gate increases in a reading operation, the high voltage of said control gate is supplied to a channel region of the on-state transistor, and said insulating gate transistor is turned on.

8. A semiconductor memory device comprising:
a select transistor having a gate, a source, and a drain, wherein said gate is connected to a select line, and said drain is connected to a column line;
a memory transistor of an insulating gate type having a floating gate in which electrons are injected by a tunnel effect and from which electrons are emitted by a tunnel effect, and a control gate, wherein a drain of said memory transistor is connected to the source of said select transistor and a source of said memory transistor is connected to a power source, and said control gate is connected to a program line; and
a transistor including said control gate and said floating gate wherein a portion of said control gate corresponding to said floating gate is a channel region having impurity concentration, which is lower than that of other portions of said control gate, and said floating gate is a gate electrode controlling said channel region.

* * * * *